United States Patent
Ting et al.

(10) Patent No.: US 10,199,959 B2
(45) Date of Patent: Feb. 5, 2019

(54) PIEZOELECTRIC ACTUATOR, CERAMIC COMPONENT POLARIZING METHOD AND PIEZOELECTRIC MOTOR SYSTEM

(71) Applicant: Chung-Yuan Christian University, Tao Yuan County (TW)

(72) Inventors: Yung Ting, Tao Yuan County (TW); Sheuan-Perng Lin, Tao Yuan County (TW); Hao-Ping Lin, Tao Yuan County (TW)

(73) Assignee: CHUNG-YUAN CHRISTIAN UNIVERSITY, Chung Li, Tao Yuan County (TW)

( * ) Notice: Subject to any disclaimer, the term of this patent is extended or adjusted under 35 U.S.C. 154(b) by 498 days.

(21) Appl. No.: 14/996,080

(22) Filed: Jan. 14, 2016

(65) Prior Publication Data

US 2016/0211776 A1    Jul. 21, 2016

Related U.S. Application Data

(60) Provisional application No. 62/104,170, filed on Jan. 16, 2015.

(51) Int. Cl.
| | |
|---|---|
| *H01L 41/09* | (2006.01) |
| *H02N 2/00* | (2006.01) |
| *H01L 41/257* | (2013.01) |
| *H02N 2/02* | (2006.01) |

(52) U.S. Cl.
CPC ......... *H02N 2/001* (2013.01); *H01L 41/0913* (2013.01); *H01L 41/0993* (2013.01); *H01L 41/257* (2013.01); *H02N 2/006* (2013.01); *H02N 2/0045* (2013.01); *H02N 2/026* (2013.01)

(58) Field of Classification Search
CPC ...... H02N 2/001; H02N 2/0045; H02N 2/006; H02N 2/026; H01L 41/0913; H01L 41/0993; H01L 41/257; H01L 41/157
USPC ............. 310/323.16, 333, 357; 264/435, 436
See application file for complete search history.

(56) References Cited

U.S. PATENT DOCUMENTS

| | | | | |
|---|---|---|---|---|
| 3,219,850 A | * | 11/1965 | Langevin ........... | G01C 19/5642 310/333 |
| 3,437,851 A | * | 4/1969 | Cady ..................... | H03H 9/176 310/329 |
| 3,842,294 A | * | 10/1974 | Doi ........................ | H03H 9/125 310/321 |
| 4,736,132 A | * | 4/1988 | Culp ..................... | G02B 26/06 310/328 |
| 4,928,030 A | * | 5/1990 | Culp ................... | H01L 41/0825 310/317 |

(Continued)

FOREIGN PATENT DOCUMENTS

| | | | | |
|---|---|---|---|---|
| JP | 2002056635 A | * | 2/2002 | ............. G11B 21/10 |
| WO | WO02004107554 A2 | * | 12/2004 | |

*Primary Examiner* — Thomas Dougherty
(74) *Attorney, Agent, or Firm* — Muncy, Geissler, Olds & Lowe, P.C.

(57) ABSTRACT

The piezoelectric actuator of the present invention has at least one ceramic component. The ceramic component has an output surface and two driving surfaces. The ceramic component has a height and the output surface is rectangular in shape, wherein the length of the short axis side of the output surface is shorter than the height. Therefore, when a pulse wave input voltage is applied on the driving surfaces, the output surface generates an elliptical motion.

16 Claims, 16 Drawing Sheets

(56) References Cited

U.S. PATENT DOCUMENTS

| | | | | |
|---|---|---|---|---|
| 5,039,899 A * | 8/1991 | Yamaguchi | ............ | H02N 2/004 310/323.16 |
| 5,159,225 A * | 10/1992 | Um | ................... | G02B 26/0858 310/328 |
| 5,268,611 A * | 12/1993 | Culp | ................... | H01L 41/0993 310/328 |
| 7,642,697 B2 * | 1/2010 | Iino | .................... | H01L 41/0913 310/323.02 |
| 8,299,682 B2 * | 10/2012 | Takizawa | ............ | H02N 2/0045 310/323.02 |
| 2003/0122450 A1 * | 7/2003 | Mitani | ............... | H03H 9/02157 310/321 |
| 2014/0001923 A1 * | 1/2014 | Ting | .................... | H02N 2/0045 310/323.16 |

\* cited by examiner

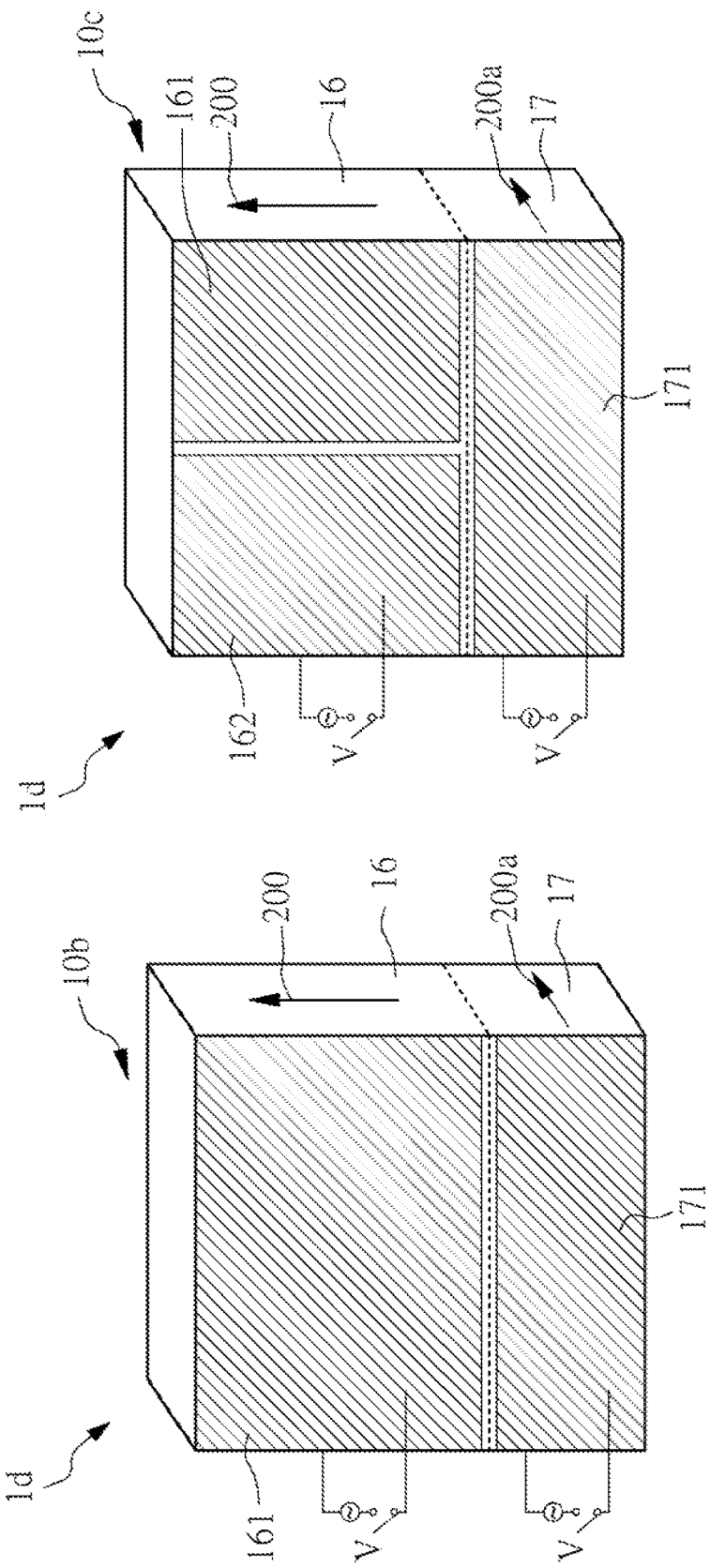

PIEZOELECTRIC ACTUATOR, CERAMIC COMPONENT POLARIZING METHOD AND PIEZOELECTRIC MOTOR SYSTEM

CROSS REFERENCE TO RELATED APPLICATIONS

This application claims priority of U.S. Provisional Application No. 62/104,170 filed on Jan. 16, 2015 under 35 U.S.C. § 119(e), the entire contents of all of which are hereby incorporated by reference.

BACKGROUND OF THE INVENTION

1. Field of the Invention

The invention relates to a piezoelectric actuator, a ceramic component polarizing method, and a piezoelectric motor system, and particularly to a face shear piezoelectric actuator, a ceramic component polarizing method for the ceramic component within the face shear piezoelectric actuator, and a face shear piezoelectric motor system.

2. Description of the Related Art

Please refer to FIG. 1. FIG. 1 is a schematic drawing showing the prior art ceramic component driven by an input voltage. As shown in FIG. 1, a height h of a piezoelectric ceramic component 300 equals a distance between the two electrodes thereof. A voltage is applied to the surfaces where the two electrodes are located to cause face shear deformation in its thickness direction. To increase deformation in the component shear direction, it is necessary to increase the height h of the piezoelectric ceramic component 300, albeit at the expense of changing the distance between the electrodes. To maintain the electric field strength (which equals the quotient obtained by dividing the input voltage by the thickness of the piezoelectric ceramic component 300; i.e., E=V/t) required for driving the piezoelectric ceramic component 300, it is necessary to increase the input voltage, albeit at the expense of ending up with an overly high input voltage. Furthermore, with the output surface 310 of the piezoelectric ceramic component 300 being identical to the driving surface, there is difficulty in connecting the electrodes; therefore, an improvement is needed.

SUMMARY OF THE INVENTION

It is an object of the present invention to provide a face shear piezoelectric actuator, a ceramic component polarizing method for the ceramic component within the face shear piezoelectric actuator, and a face shear piezoelectric motor system.

In order to achieve the above-mentioned object, a piezoelectric actuator of the present invention comprises at least one ceramic component. The ceramic component comprises an output surface and two driving surfaces. The ceramic component has a height and the output surface is rectangular in shape, wherein a length of the short axis side of the output surface is shorter than the height. Therefore, when a pulse wave input voltage is applied on the driving surfaces, the output surface generates an elliptical motion.

The present invention further provides a ceramic component polarizing method applied on the ceramic component of the above-mentioned piezoelectric actuator, wherein the ceramic component comprises two driving surfaces and the output surface is rectangular in shape. The two driving surfaces individually connect with the two long axis sides of the output surface. The ceramic component polarizing method includes the following steps: coating an electrode on the output surface and the lower surface; applying a DC voltage in a direction perpendicular to the output surface for creating a polarization direction; and removing the electrode on the output surface and on the lower surface.

The present invention further provides a piezoelectric motor system comprising the above-mentioned piezoelectric actuator, a base, a housing, a plurality of fixed springs and a preload spring. The piezoelectric actuator comprises an output head. The base is employed for bearing the piezoelectric actuator, wherein the output head protrudes to the housing and a plurality of fixed springs are individually disposed on two sides of the piezoelectric actuator for reducing the space between the piezoelectric actuator and the housing. The preload spring is disposed beneath the piezoelectric actuator for allowing the output head to touch a transmission target.

BRIEF DESCRIPTION OF THE DRAWINGS

These and other objects and advantages of the present invention will become apparent from the following description of the accompanying drawings, which disclose several embodiments of the present invention. It is to be understood that the drawings are to be used for purposes of illustration only, and not as a definition of the invention.

In the drawings, wherein similar reference numerals denote similar elements throughout the several views:

FIG. 13a to FIG. 13b illustrates how the fifth embodiment of the piezoelectric actuator operates.

DETAILED DESCRIPTION OF THE PREFERRED EMBODIMENT

Embodiments are provided in the following description in order to further present in detail the implementations of the present invention. It should be noted that the objects used in the diagrams of the embodiments are provided with proportions, dimensions, deformations, displacements and details as examples and that the present invention is not limited thereto; also to be noted is that identical components in the embodiments are given the same component numbers.

Figure 2:
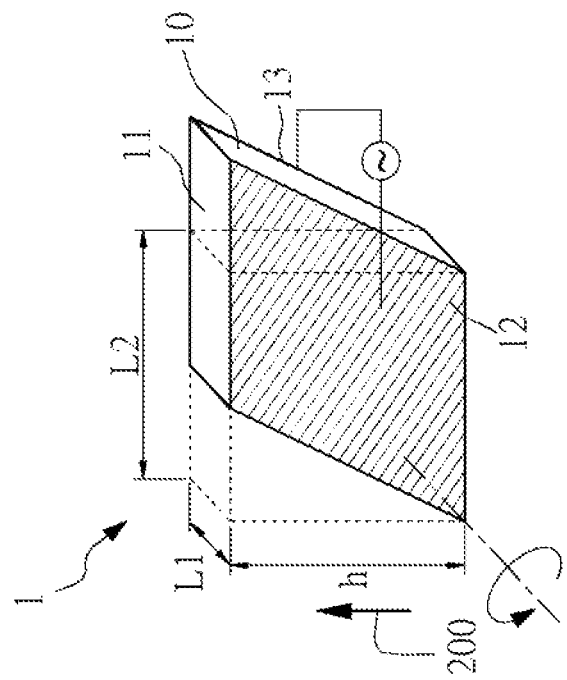
FIG. 2 is a schematic drawing showing the piezoelectric actuator of the present invention driven by an input voltage.
Figure 1:
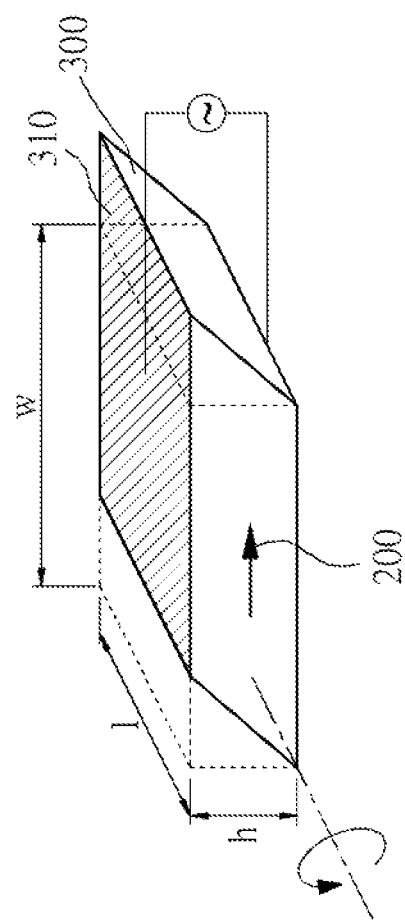
FIG. 1 is a schematic drawing showing the prior art ceramic component driven by an input voltage.

As shown in FIG. 2, in the present embodiment, the piezoelectric actuator 1 of the present invention comprises one ceramic component 10 with an output surface 11 and two driving surfaces 12, 13. The output surface 11 of the present embodiment is rectangular in shape and the output surface 11 has a short axis side L1 and a long axis side L2. The two driving surfaces 12, 13 individually connect with the two long axis sides L2 of the output surface 11. The ceramic component 10 has a height h and can be a plate that is rectangular or square in shape. In the present embodiment, the length of the long axis side L2 of the output surface 11 is equal to the height h of the ceramic component 10. The length of the short axis side L1 of the output surface 11 is smaller than the height h. It is noted that, according to one embodiment of the present invention, the length of the short axis side L1 of the output surface 11 is less than the height h of the ceramic component 10 and less than a quarter of the length of the long axis side L2 of the output surface 11.

Figure 3:
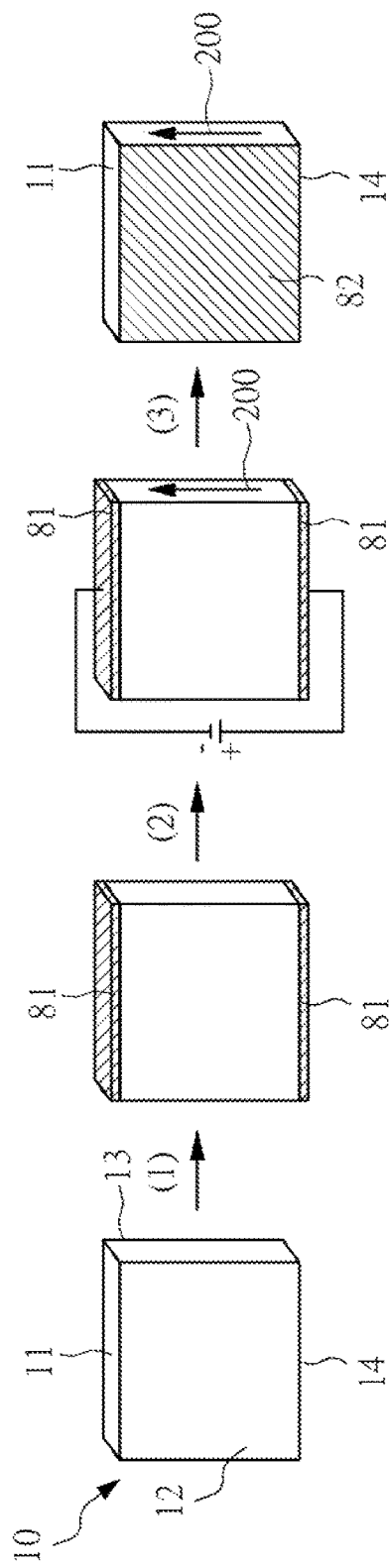
FIG. 3 is a schematic drawing showing a manufacturing process of the piezoelectric actuator of the present invention.

As shown in FIG. 3, the ceramic component 10 of the piezoelectric actuator 1 is manufactured by the following steps: Step 1: Coating an electrode 81 on the output surface 11 of the ceramic component 10 and the lower surface 14 opposite to the output surface 11. Step 2: Applying a DC voltage in a direction perpendicular to the output surface 11 for creating a polarization direction 200. Step 3: Removing the electrode 81 on the output surface 11 and the lower surface 14. Step 4: Coating an electrode 82 on the driving surfaces 12, 13 of the ceramic component 10.

Figure 4:
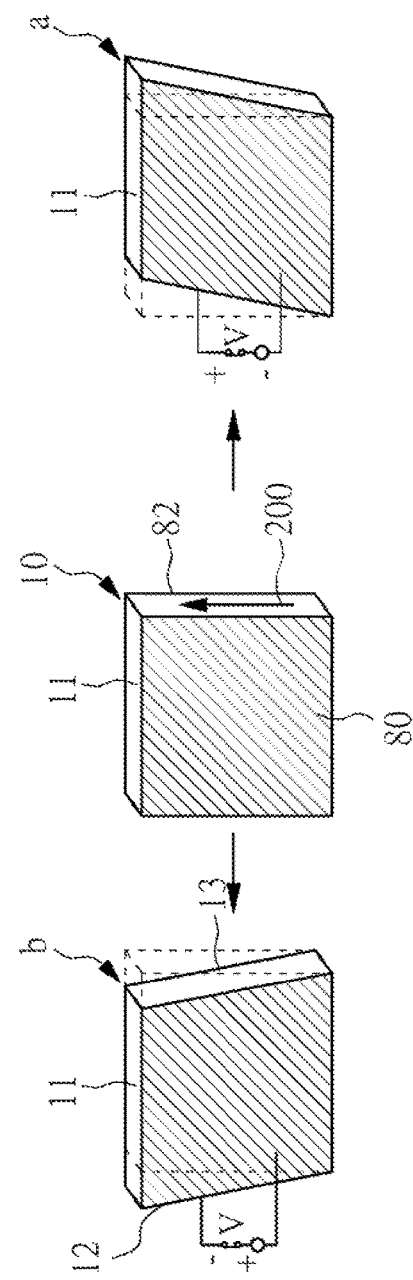
FIG. 4 illustrates a view of the piezoelectric actuator of the present invention when a constant voltage is applied to it.
Figure 5:
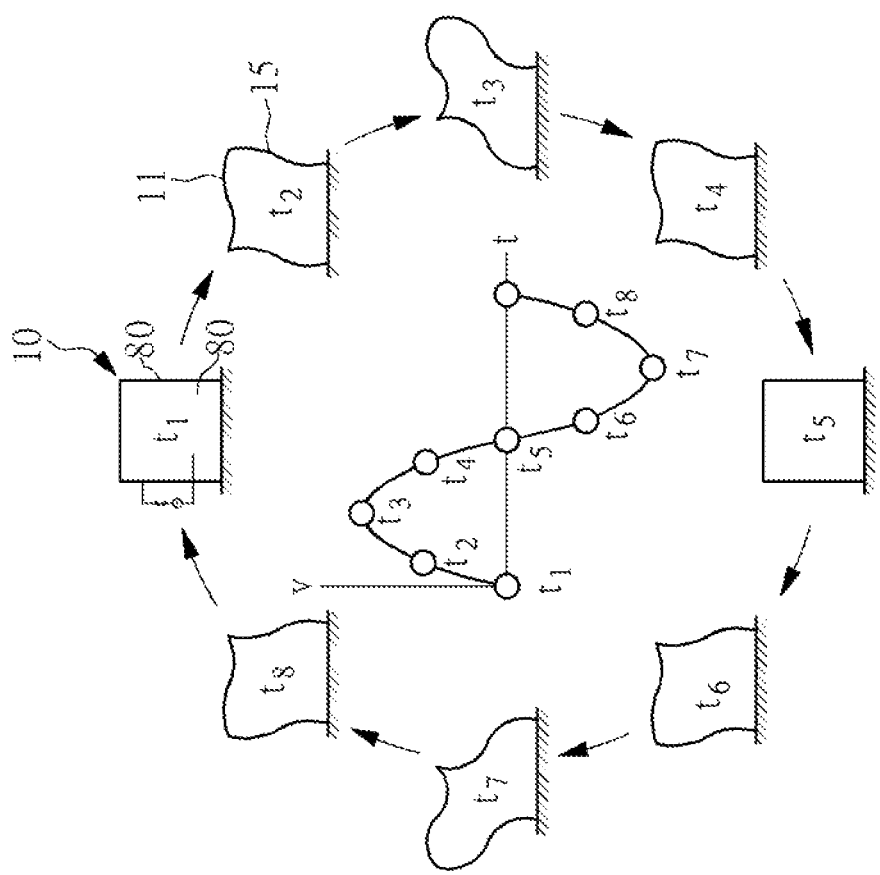
FIG. 5 illustrates how the piezoelectric actuator of the present invention operates when a pulse wave voltage is applied to it.

Please refer to FIG. 4 and FIG. 5, wherein FIG. 4 illustrates a view of the piezoelectric actuator of the present invention when a constant voltage is applied to it, and FIG. 5 illustrates how the piezoelectric actuator of the present invention operates when a pulse wave voltage is applied to it.

As shown in FIG. 4, a constant voltage is applied to the electrodes 80 on the driving surfaces 12, 13 to cause face shear deformation a in the ceramic component 10 because of an inverse piezoelectric effect. Face shear deformation b occurs in the ceramic component 10 in the opposite direction as a result of switching between the positive and negative poles for applying the constant voltage. As shown in FIG. 5, a pulse wave input voltage (AC-driven electric field) is applied to the piezoelectric actuator 1 for generating full wave resonance on the output surface 11 and the side surface 15 of the ceramic component 10 so as to synthesize face shear vibration. The application of a sinusoidal AC voltage, for example −150V to +150V, to the two electrodes 80 during the operation of the piezoelectric actuator 1 is illustrated in FIG. 5. At time point $t_1$, the input AC voltage is 0V and thus the ceramic component 10 retains its original geometric cubic shape rather than deforming. At time point t2, the input AC voltage increases and thus the output surface 11 and side surface 15 of the ceramic component 10 undergo slight full-wave deformation. At time point t3, the input AC voltage is maximized and thus the output surface 11 and side surface 15 of the ceramic component 10 undergo maximal-amplitude full-wave resonance deformation. At time point $t_4$, the input AC voltage decreases and thus the full-wave deformation of the ceramic component 10 is reduced. At time point t5, the input AC voltage is 0V and thus the ceramic component 10 returns to its original geometric cubic shape. It is noted that, with the input voltage being an AC voltage, the voltage levels for driving the ceramic component 10 at $t_5 \sim t_8$ are negative; hence, the deformation of the ceramic component 10 at $t_5 \sim t_8$ is equal in magnitude but opposite in direction to the deformation of the ceramic component 10 at $t_1 \sim t_5$. If the deformations of $t_1 \sim t_8$ repeat continuously, the mass points on the output surface 11 of the ceramic component 10 will undergo an elliptical motion in forward and backward directions in response to the alternation of the positive and negative input AC voltages.

Figure 6:
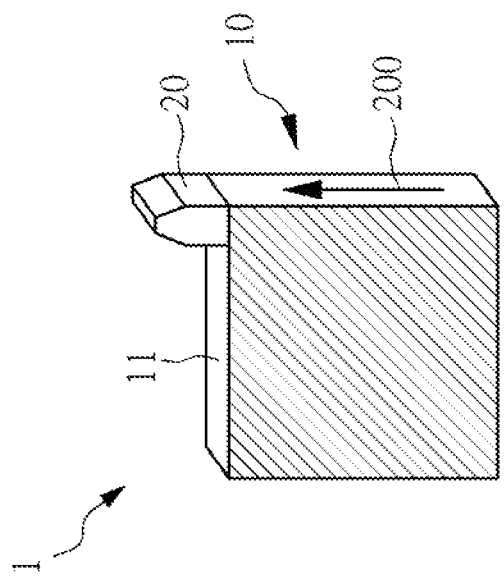
FIG. 6 illustrates the first embodiment of the piezoelectric actuator.
Figure 7:
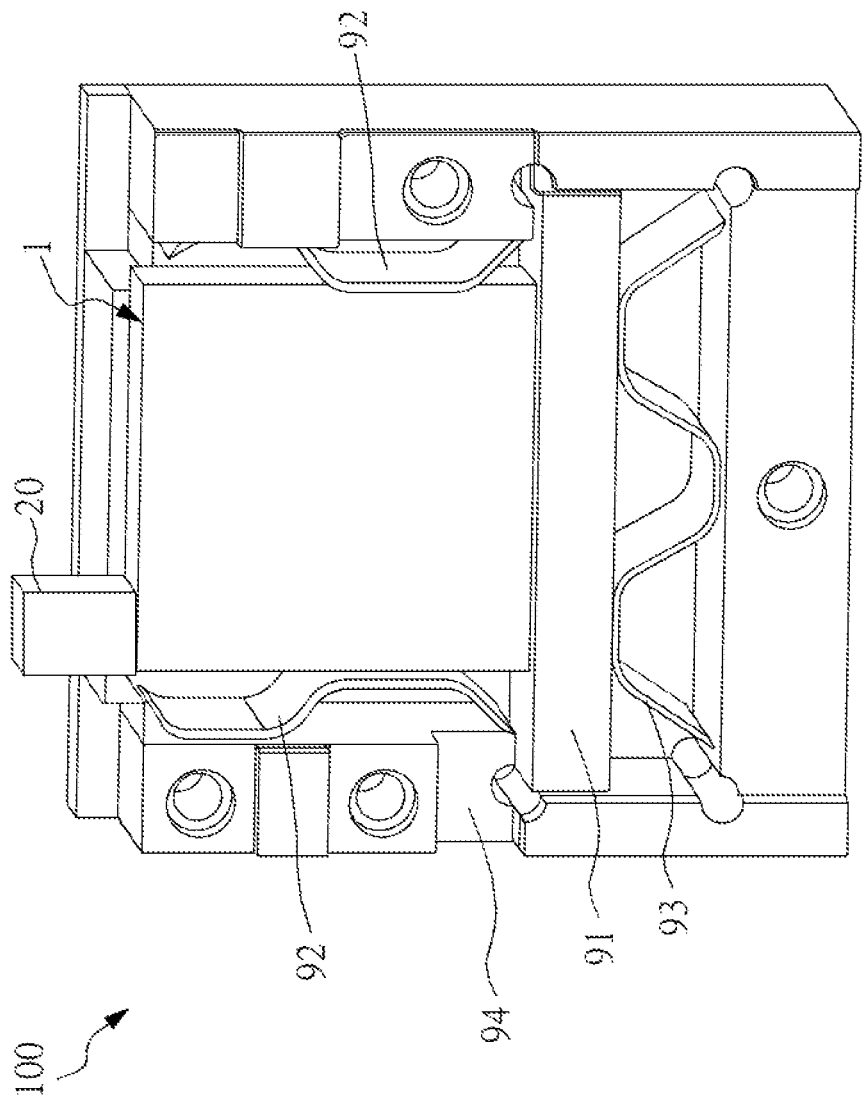
FIG. 7 illustrates an embodiment of the piezoelectric motor system of the present invention.
Figure 8:
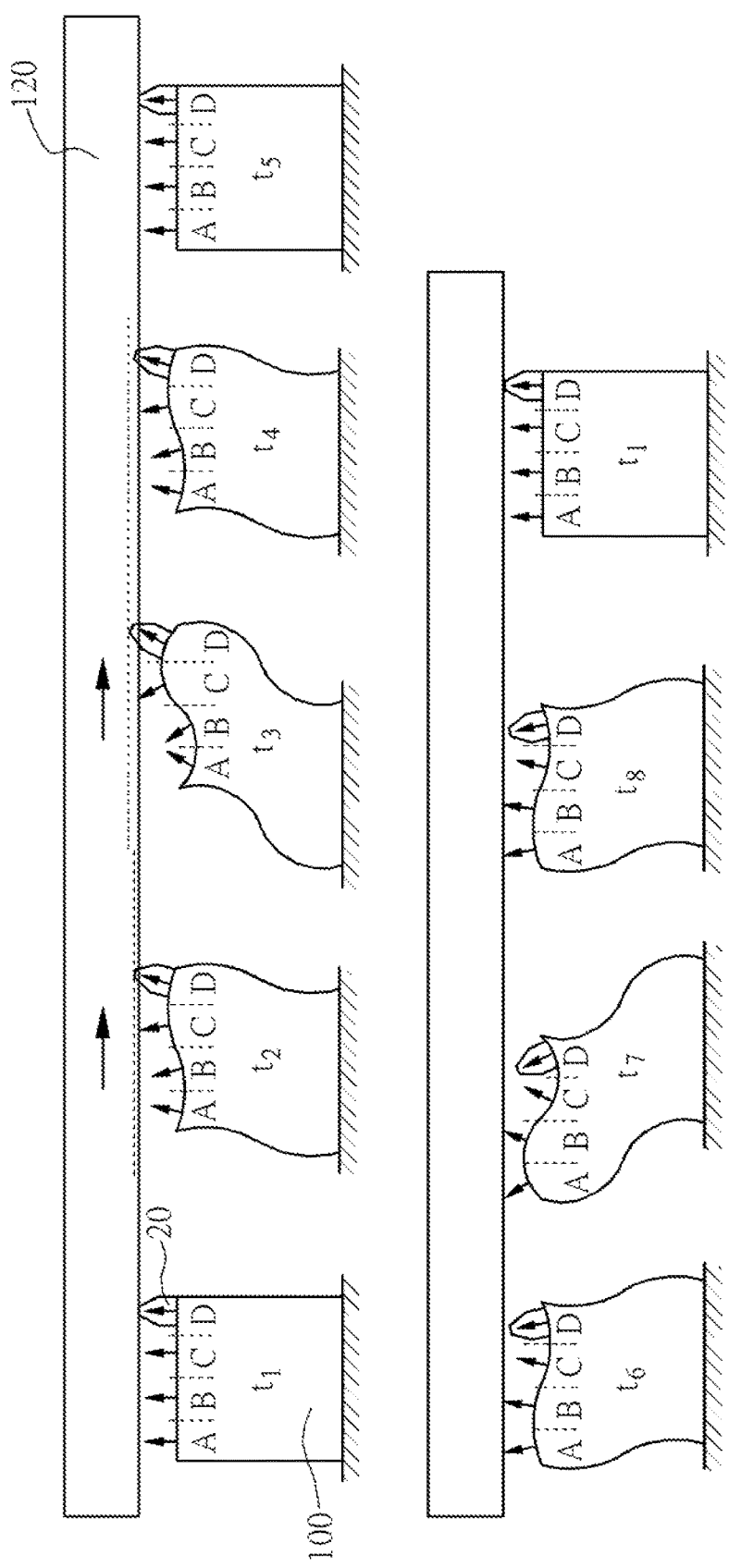
FIG. 8 shows schematically how the piezoelectric motor system of the present invention operates.

Please refer to FIG. 6 to FIG. 8. FIG. 6 illustrates a first embodiment of the piezoelectric actuator; FIG. 7 illustrates an embodiment of the piezoelectric motor system of the present invention; FIG. 8 shows schematically how the piezoelectric motor system of the present invention operates.

As shown in FIG. 6, an output head 20 is disposed on the output surface 11 of the ceramic component 10 of the piezoelectric actuator 1. The output head 20 of the present embodiment is an aluminum oxide ceramic material, and the output head 20 is employed for amplifying the lateral displacement effectuated by the piezoelectric actuator 1 and for providing a desired level of contact with a transmission target 120. It should be noted that the location of the output head 20 on the output surface 11 can be modified according to actual demands. As shown in FIG. 7, in the present embodiment, the piezoelectric motor system 100 of the present invention comprises a piezoelectric actuator 1 as shown in FIG. 6, a base 91, a housing 94, two fixed springs 92 and a preload spring 93.

As shown in FIG. 7 and FIG. 8, the piezoelectric actuator 1 is situated above the base 91, and the output head 20 protrudes to the piezoelectric motor system 100 so as to touch the transmission target 120. The two lateral sides of the piezoelectric actuator 1 have one fixed spring 92 disposed to reduce the space in the piezoelectric motor system 100; therefore, the output loss of the piezoelectric motor system 100 can be reduced when the piezoelectric motor system 100 operates. It is noted that, according to one embodiment of the present invention, the base 91 is composed of high density aluminium oxides. The bottom of the piezoelectric actuator 1 adheres with the base 91 to constraint the bottom of the piezoelectric actuator 1 so as to increase the displacement of the output surface 11. The base 91 is situated between the preload spring 93 and the piezoelectric actuator 1. With the preload spring 93, the piezoelectric motor system 100 can touch the transmission target 120 properly. As a result, the thrust generated by the piezoelectric motor system 100 can be transmitted properly to the transmission target 120.

In the present embodiment, the piezoelectric actuator 1 is driven by full-wave resonance AC voltage, such as −150V to 150V. In the present embodiment, the piezoelectric actuator 1 is 14 mm long, 14 mm wide, and 3 mm thick. The full-wave resonance frequency is identified by spectral analysis, and the piezoelectric actuator 1 is driven by a resonance circuit electric field of about ±10~±50 V/mm. FIG. 8 presents the operation of the piezoelectric actuator 1 when a sinusoidal AC voltage is applied to the piezoelectric actuator 1. As shown in FIG. 8, the output surface of the ceramic component is divided, in accordance with ¼ full wave, into four equal portions, namely, zones A, B, C, and D, wherein the arrows in the four zones always point in the normal directions of the mass points within the zones, respectively. In the present embodiment, as shown in FIG. 8, the output head 20, being adhered to zone D and adjacent to a transmission target 120, allows the piezoelectric actuator 1 to undergo full-wave resonance deformation at time points $t_1 \sim t_3$ to thereby enable the output head 20 to generate a thrust in directions parallel to the normal directions of the mass points within zone D, so as to cause the transmission target 120 to move rightward. At time point $t_4$, the amplitude of the full-wave resonance of the output surface of the ceramic component is reduced, so the transmission target 120 lags behind the wavy ascent and descent of the output surface of the ceramic component because of inertia such that the output head 20 will separate from the transmission target 120. At time point $t_5$, the piezoelectric actuator 1 is restored to its original geometric cubic shape, and the input AC voltage level is negative at time points $t_5 \sim t_8$ to thereby generate full-wave resonance opposite in waveform to the full-wave resonance generated at time points $t_1 \sim t_5$. At this point in time, the output head 20 positioned in zone D of the piezoelectric actuator 1 corresponds in position to a full-wave trough, and thus the opposite thrust generated from the output head 20 prevents the distance traveled by the transmission target 120 at time points $t_1 \sim t_5$ from being shortened because the output head 20 is not in contact with the transmission target 120. Every instance of driving the transmission target 120 to move rightward in a unidirectional manner by the piezoelectric actuator 1 takes place at time points $t_1 \sim t_8$. Likewise, if the output head 20 is adhered to zone A on the piezoelectric actuator 1, the transmission target 120 can be driven to move leftward in a unidirectional manner. It is noted that only the piezoelectric actuator 1 of the piezoelectric motor system 100 is illustrated in FIG. 8; other components are omitted.

Figure 9:
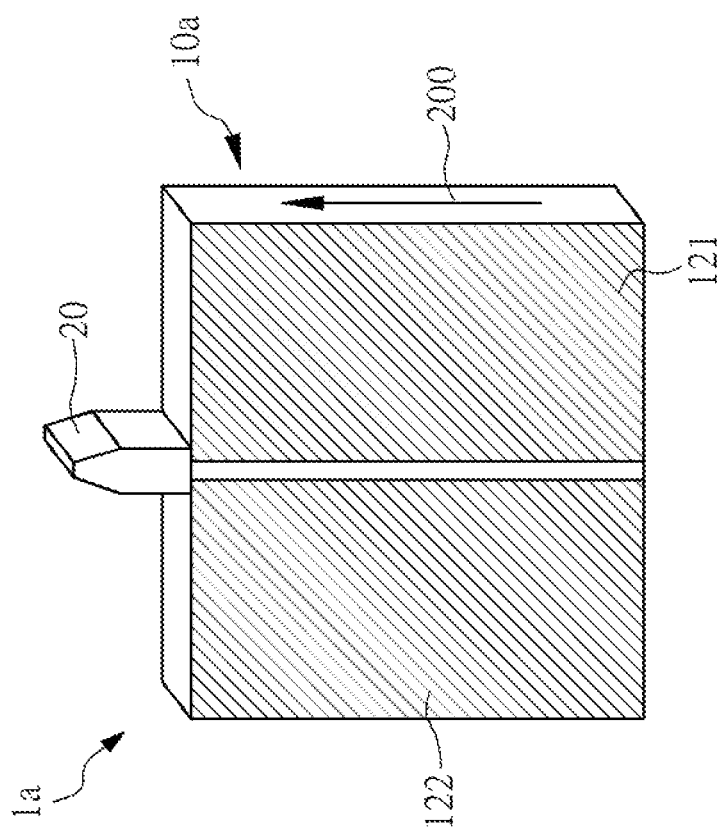
FIG. 9 illustrates the second embodiment of the piezoelectric actuator.
Figure 10:
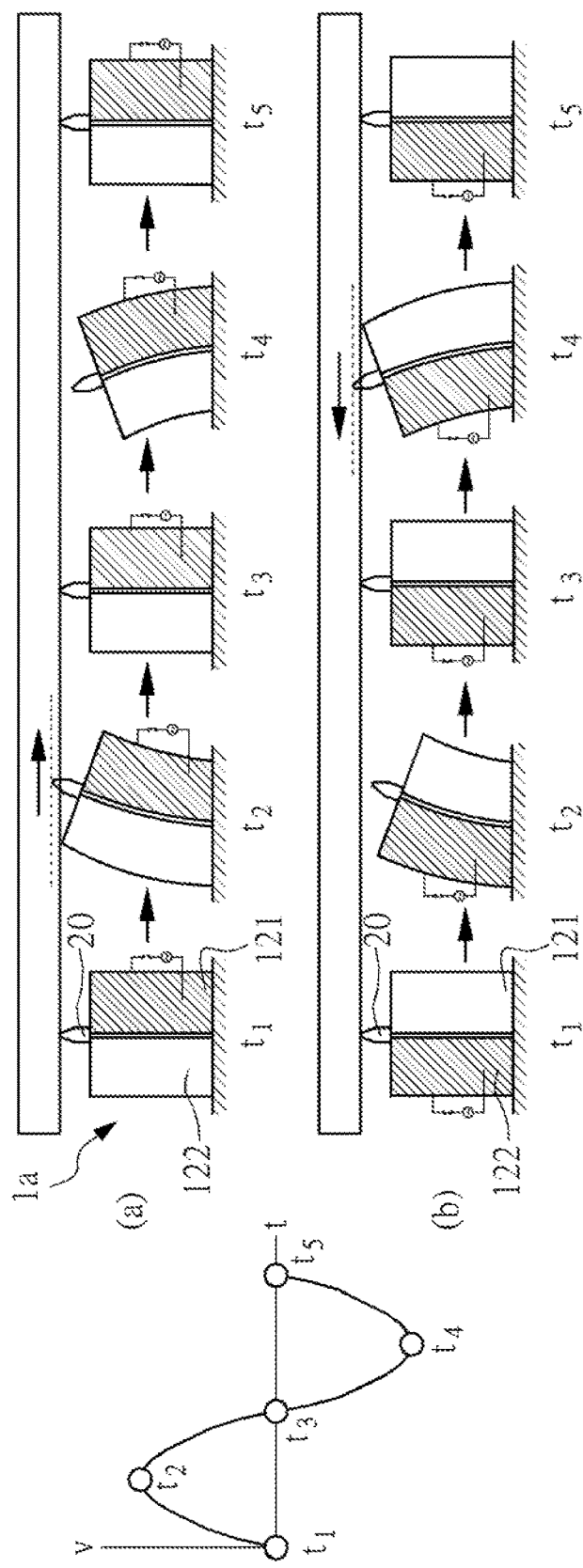
FIG. 10 shows schematically how the second embodiment of the piezoelectric actuator operates.

Please refer to FIG. 9 and FIG. 10. FIG. 9 illustrates a second embodiment of the piezoelectric actuator; FIG. 10 shows schematically how the second embodiment of the piezoelectric actuator operates.

As shown in FIG. 9, to allow a single piezoelectric actuator 1a to be driven to move laterally in opposite directions, it is feasible to divide the driving surface 12 of the piezoelectric actuator 1a into a first electrode 121 and a second electrode 122. The output head 20 is adhered to the output surface 11, which is adhered to the junction of the first electrode 121 and the second electrode 122. It is noted that there are two electrodes in the piezoelectric actuator 1a; i.e., the first electrode 121 and the second electrode 122. These two electrodes do not communicate with each other. Thus, the transmission target 120 can be pushed in opposite directions by applying a input voltage on the first electrode 121 or on the second electrode 122, as shown in FIG. 10.

Furthermore, a pulse wave input voltage (AC-driven electric field) is applied to the ceramic component 10a for generating half wave resonance, as shown in FIG. 10, on the side surface 15 of the ceramic component 10a so as to synthesize face shear vibration. As shown in FIG. 10, when the input voltage is applied on the first electrode 121, composite deformation is generated, as shown in FIG. 10(a). The mass points on the output surface 11 undergo elliptical motion at the junction of the first electrode 121 and the second electrode 122 for providing side thrusts. When the input voltage is switched to the second electrode 122, elliptical motion of the mass points occurs in the opposite direction and thus causes laterally-driven motion to occur in the opposite direction, as illustrated with the motion shown in FIG. 10(b).

Figure 11A:
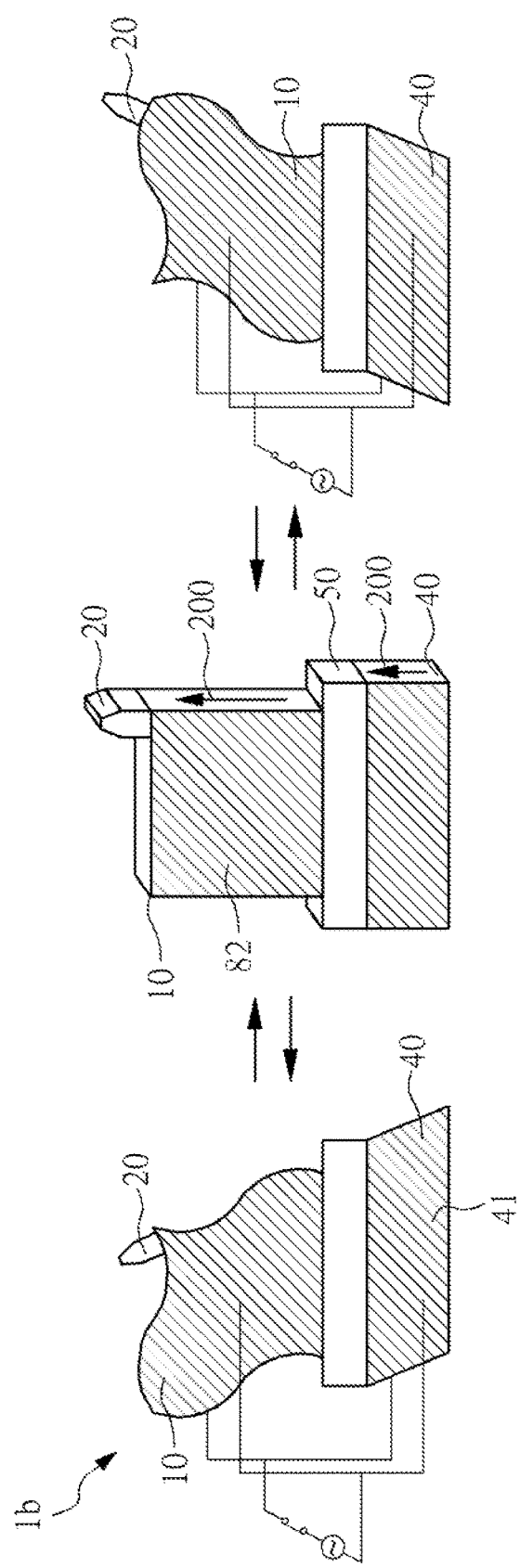
FIG. 11a to FIG. 11d illustrates how the third embodiment of the piezoelectric actuator operates.
Figure 11B:
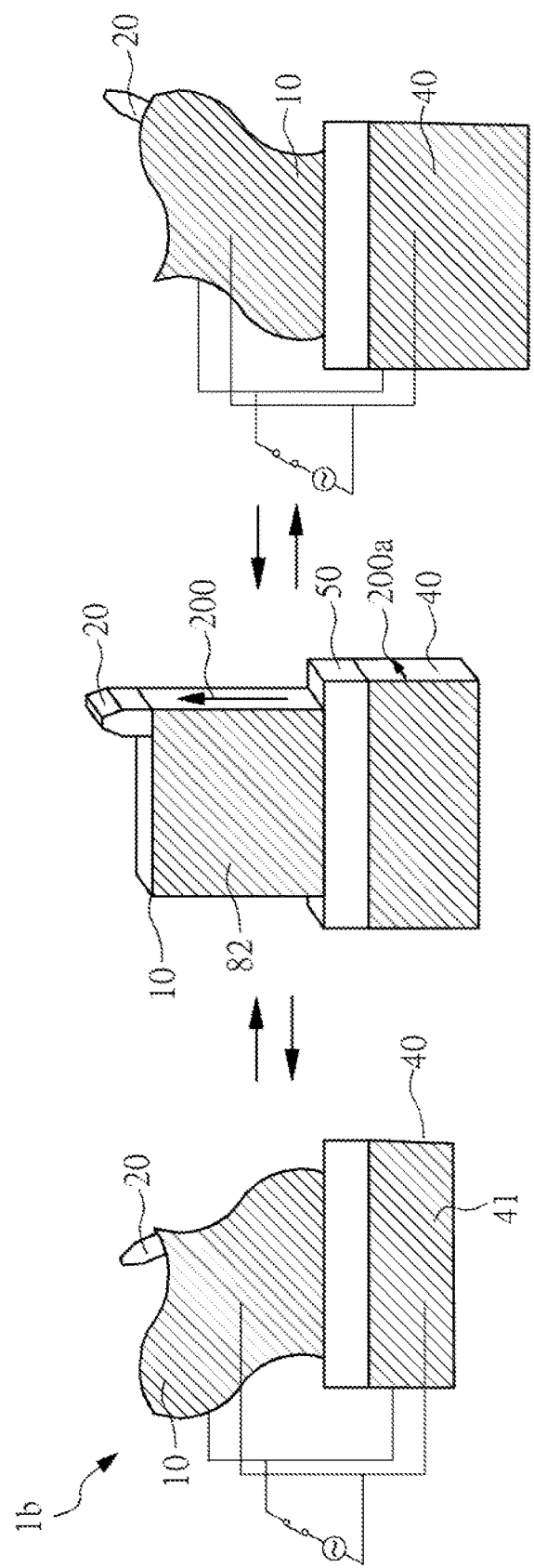

Please refer to FIG. 11a to FIG. 11d. FIG. 11a to FIG. 11d illustrate how the third embodiment of the piezoelectric actuator operates. As shown in FIG. 11a, the piezoelectric actuator 1b comprises a displacement amplifying element 40 and an insulated ceramic block 50 for amplifying the transverse displacements of the piezoelectric actuator 1b. The displacement amplifying element 40 is a d14 piezoelectric actuator that is rectangular in shape, and its polarization direction 200 in the present embodiment is upward. The displacement amplifying element 40 is adhered to the ceramic component 10 by the insulated ceramic block 50. Superposition of deformation and displacement is achieved by specific driving sources which are identical and connected in parallel to increase not only lateral displacement but also motor transmission speed. As shown in FIG. 11b, the polarization direction 200a of the displacement amplifying element 40 can be switched as a direction that entering into the paper for amplifying longitudinal displacement by superposition of the deformation, and displacement is achieved by specific driving sources which are identical and connected in parallel.

Figure 11C:
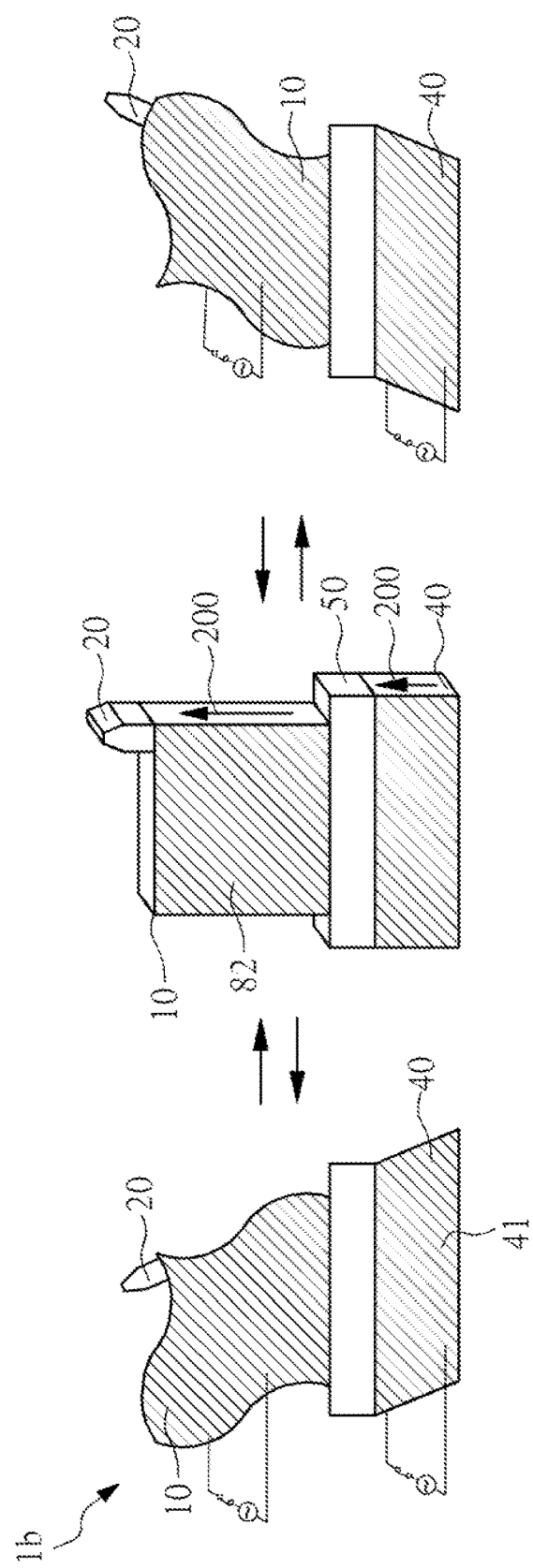
Figure 11D:
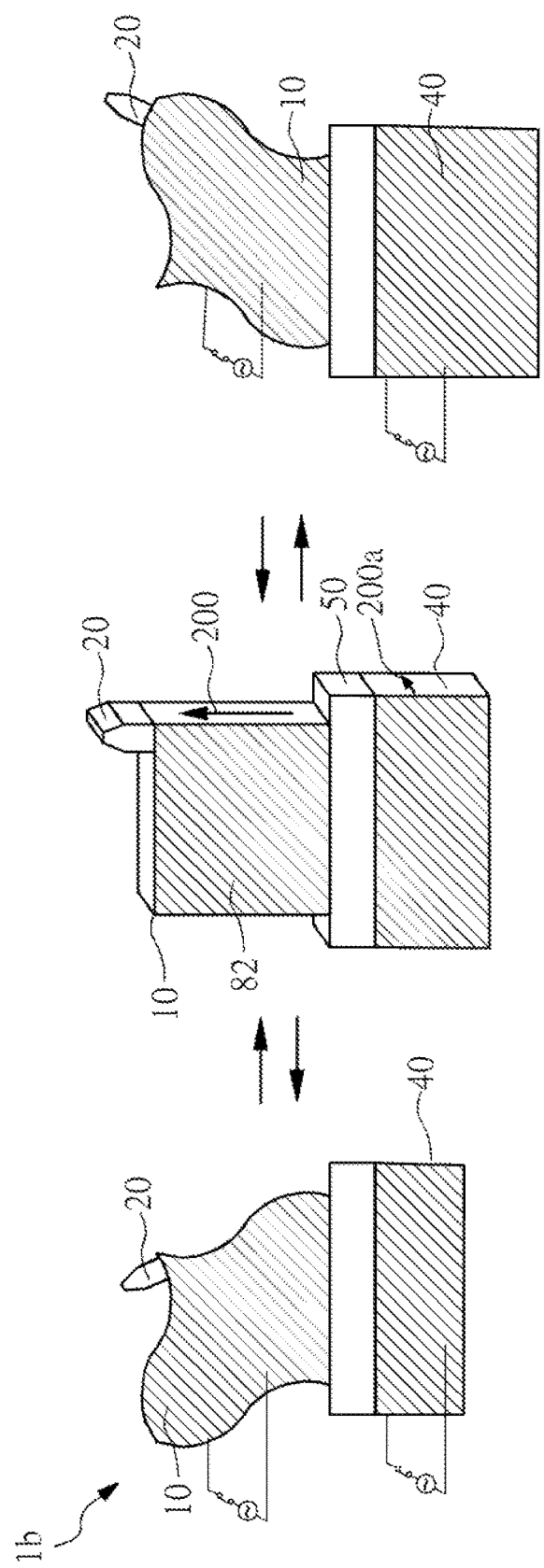

Furthermore, as shown in FIG. 11c to FIG. 11d, the electrode 82 of the ceramic component 10 and the electrode 41 of the displacement amplifying element 40 can be driven by two independent input voltages. The output of the output surface of the piezoelectric actuator 1b can be manipulated by providing different voltage phases to the electrode 82 and the electrode 41. It is noted that the frequencies of the input voltage provided to the electrode 82 and the electrode 41 must be identical. Otherwise, the ceramic component 10 cannot synchronize with the displacement amplifying element 40 and poor output will result.

Figure 12A:
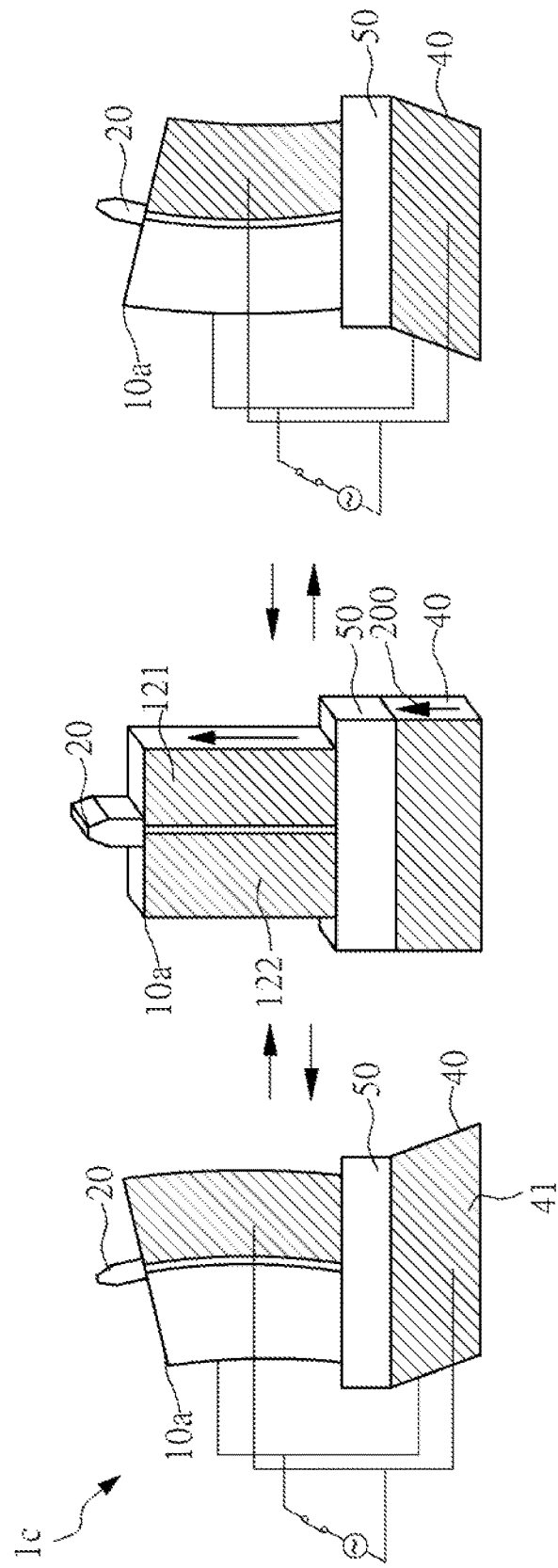
FIG. 12a to FIG. 12d illustrates how the fourth embodiment of the piezoelectric actuator operates.

Please refer to FIG. 12a to FIG. 12d. FIG. 12a to FIG. 12d illustrate how the fourth embodiment of the piezoelectric actuator operates. As shown in FIG. 12a, the piezoelectric actuator 1c is formed by the combination of the ceramic component 10a, the displacement amplifying element 40 and the insulated ceramic block 50. The piezoelectric actuator 1c can be driven by the same driving method presented in FIG. 11a and FIG. 11b to generate the operations shown in FIG. 12a and FIG. 12b.

Figure 12B:
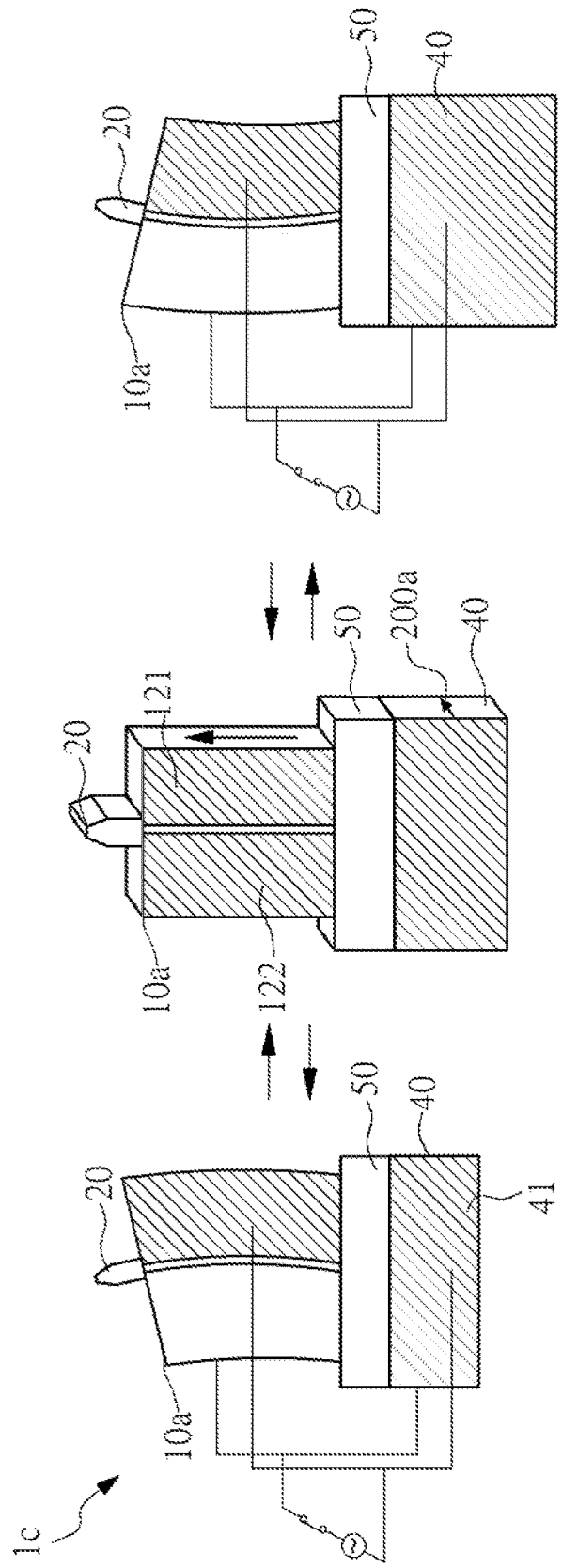
Figure 12C:
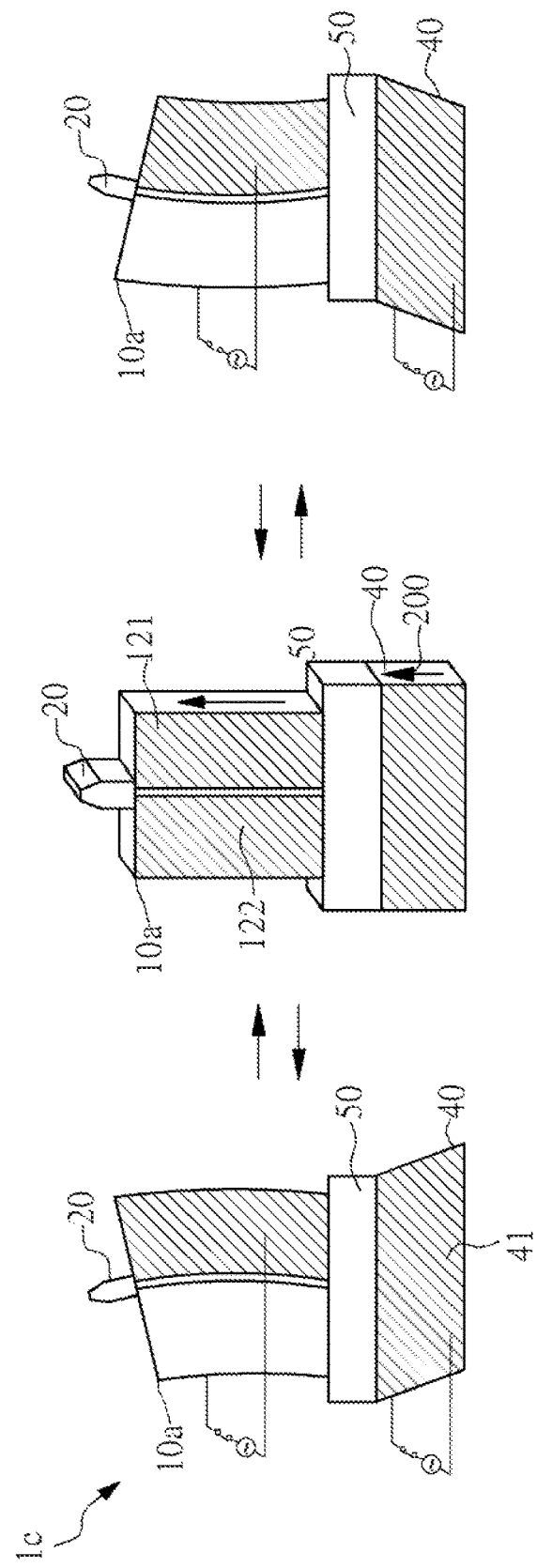
Figure 12D:
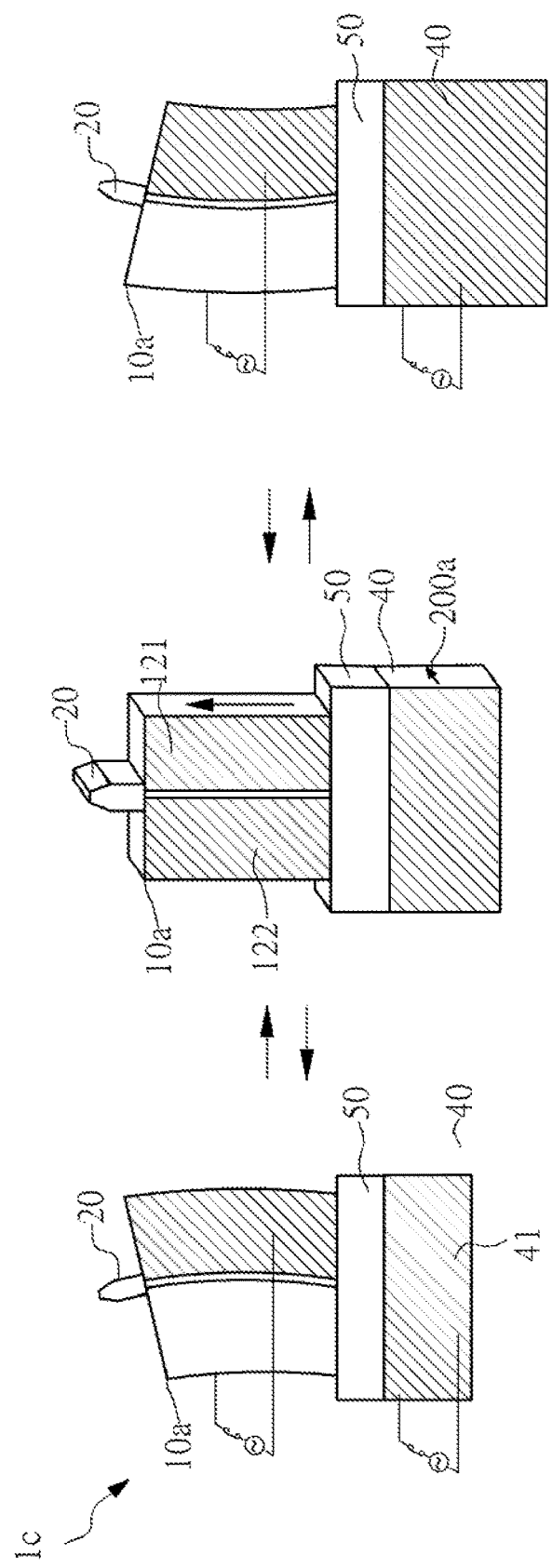

As shown in FIG. 12c and FIG. 12d, the piezoelectric actuator 1c can also be driven by two independent input voltages by providing the ceramic component 10a, which drives the first electrode 121 or the second electrode 122, and the electrode 41 of the displacement amplifying element 40 with different phases to manipulate the output effect of the piezoelectric actuator 1c. It is noted that the frequencies of the input voltage provided to the ceramic component 10a and the electrode 41 must be identical; otherwise, the ceramic component 10a cannot synchronize with the displacement amplifying element 40 and poor output will result. Moreover, the first electrode 121 of the ceramic component 10a and the electrode 41 being driven in FIG. 12a to FIG. 12d are for illustration only. The same effect in the opposite direction can be achieved by switching the input voltage to the second electrode 122 of the ceramic component 10a and the electrode 41.

Please refer to FIG. 13a and FIG. 13b. FIG. 13a to FIG. 13b illustrate how the fifth embodiment of the piezoelectric actuator operates. As shown in FIG. 13a, the ceramic component 10b comprises two polarizing regions 16, 17, wherein the polarization directions in the polarizing region 16 and the polarizing region 17 are different for amplifying the longitudinal displacement of the piezoelectric actuator 1d so as to increase the longitudinal thrust when the ceramic component 10b of the piezoelectric actuator 1d pushes the transmission target. It is noted that the ceramic component 10b can be driven by identical driving sources connected in parallel, as shown in FIG. 11b, or by providing independent driving sources to the electrode 161 of the polarizing region 16 and the electrode 171 of the polarizing region 17, as shown in FIG. 11d. The output of the output surface of the ceramic component 10b of the piezoelectric actuator 1d can be manipulated by providing different voltage phases to the electrode 161 and the electrode 171. It is noted that the frequencies of the input voltage provided to the polarizing region 16 and the polarizing region 17 must be identical.

Otherwise, the polarizing region 16 cannot synchronize with the polarizing region 17 and poor output will result.

As shown in FIG. 13b, the polarizing region 16 can be coated with two electrodes 161, 162, wherein there is no connection among the electrodes 161, 162, or the electrode 171. The ceramic component 10c can be driven by identical driving sources connected in parallel, as shown in FIG. 12b, or by providing independent driving sources to the electrode 171 and the polarizing region 16, choosing an electrode 161 or 162. The choice of the electrode 161 or 162 is based on the direction that the transmission target is designed to be pushed. As shown in FIG. 13b, various input voltage phases cause various outputs on the output surface of the piezoelectric actuator 1d. It is noted that the frequencies of the input voltage provided to the electrode 171 and the polarizing region 16, whether the electrode 161 or 162 is chosen, must be identical; otherwise, the polarizing region 17 cannot synchronize with the polarizing region 16 and poor output will result.

While the present invention has been particularly shown and described with reference to a preferred embodiment, it will be understood by those skilled in the art that various changes and modifications can be made to the described embodiments. It is to be understood that many other possible modifications and variations can be made without departing from the spirit and scope of the invention as hereinafter claimed.

What is claimed is:

1. A piezoelectric actuator comprising:
   at least one ceramic component comprising an output surface and two driving surfaces, the two driving surfaces being individually connected to two long axis sides of the output surface, the at least one ceramic component having a height; the output surface is rectangular in shape, wherein a length of a short axis side of the output surface is shorter than the height; and
   a displacement amplifying element being attached to the at least one ceramic component through an insulated ceramic block.

2. The piezoelectric actuator as claimed in claim 1, wherein the at least one ceramic component is a plate that is rectangular or square in shape.

3. The piezoelectric actuator as claimed in claim 1, wherein a length of a long axis side of the output surface is substantially equal to the height.

4. The piezoelectric actuator as claimed in claim 3, wherein the length of the short axis side is shorter than the height and less than a quarter of the length of the long axis side.

5. The piezoelectric actuator as claimed in claim 3, comprising an output head disposed on the output surface; the output head can be used to drive an external element when an end face generates an elliptical motion.

6. The piezoelectric actuator as claimed in claim 1, the piezoelectric actuator comprising an output head; the output head can be used to drive an external element when an end face generates an elliptical motion.

7. The piezoelectric actuator as claimed in claim 6, the two driving surfaces comprising a first electrode and a second electrode, wherein the first electrode and the second electrode do not communicate with each other and the output head is adhered to the output surface, which is adhered to a junction of the first electrode and the second electrode.

8. The piezoelectric actuator as claimed in claim 1, the at least one ceramic component comprising a plurality of polarizing regions and a polarization direction of any one of the plurality of polarizing regions is different from all the others.

9. The piezoelectric actuator as claimed in claim 8, one of the plurality of polarizing regions comprising a plurality electrodes.

10. A piezoelectric motor system comprising:
    the piezoelectric actuator as claimed in claim 1, comprising an output head;
    a base for bearing the piezoelectric actuator;
    a housing, the output head protruding to the housing;
    a plurality of fixed springs, individually disposed on two sides of the piezoelectric actuator to reduce a space between the piezoelectric actuator and the housing; and
    a preload spring, disposed beneath the piezoelectric actuator for allowing the output head to touch a transmission target.

11. The piezoelectric motor system as claimed in claim 10, wherein a length of a long axis side of the output surface is substantially equal to the height.

12. The piezoelectric motor system as claimed in claim 11, wherein the length of the short axis side is shorter than the height and less than a quarter of the length of the long axis side.

13. The piezoelectric motor system as claimed in claim 12, comprising the output head disposed on the output surface; the output head can be used to drive an external element when an end face generates an elliptical motion.

14. The piezoelectric motor system as claimed in claim 13, the driving surface comprising a first electrode and a second electrode, wherein the first electrode and the second electrode do not communicate with each other and the output head is adhered to the output surface, which is adhered to a junction of the first electrode and the second electrode.

15. The piezoelectric motor system as claimed in claim 10, the at least one ceramic component comprising a plurality of polarizing regions, wherein a polarization direction of any one of the plurality of polarizing regions is different from all the others, one of the plurality of polarizing regions comprising a plurality of electrodes.

16. The piezoelectric motor system as claimed in claim 10, wherein the at least one ceramic component is a plate that is rectangular or square in shape.

* * * * *